US007010837B2

(12) United States Patent
Takata et al.

(10) Patent No.: US 7,010,837 B2
(45) Date of Patent: Mar. 14, 2006

(54) METHOD FOR MANUFACTURING AN ELECTRONIC COMPONENT

(75) Inventors: Eiichi Takata, Nagaokakyo (JP); Yasuji Yamamoto, Shiga-ken (JP); Genji Inuidani, Kameoka (JP); Michio Kadota, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 164 days.

(21) Appl. No.: 10/410,433

(22) Filed: Apr. 9, 2003

(65) Prior Publication Data

US 2003/0231082 A1 Dec. 18, 2003

(30) Foreign Application Priority Data

Apr. 9, 2002 (JP) ............................ 2002-106301
Feb. 25, 2003 (JP) ............................ 2003-048147

(51) Int. Cl.
*H04R 17/00* (2006.01)
*C23C 14/00* (2006.01)

(52) U.S. Cl. ......................... 29/25.35; 29/594; 29/831; 29/846; 29/847; 427/523

(58) Field of Classification Search ............... 29/25.35, 29/594, 846, 847, 831; 427/523, 531, 96, 427/99; 204/192.11, 192.3–5, 192.17
See application file for complete search history.

(56) References Cited

U.S. PATENT DOCUMENTS 4,180,596 A * 12/1979 Crowder et al. ............ 438/664
4,521,081 A * 6/1985 Miyake et al. .............. 359/273
4,728,579 A 3/1988 König
4,872,905 A * 10/1989 Bourne et al. ................ 75/345
5,549,935 A * 8/1996 Nguyen et al. ............. 427/490
6,103,609 A * 8/2000 Lee et al. ................... 438/592
6,205,676 B1 * 3/2001 Fujii et al. ..................... 34/250
6,291,820 B1 * 9/2001 Hamza et al. .............. 250/282

FOREIGN PATENT DOCUMENTS

JP 05-009721 1/1993
JP 05-263226 10/1993
JP 2000-323510 11/2000
JP 2001-77653 3/2001

OTHER PUBLICATIONS

Official Communication Issued in the corresponding Chinese Application No. 03128667.4, dated Jul. 15, 2005.

* cited by examiner

*Primary Examiner*—A. Dexter Tugbang
*Assistant Examiner*—Tai Van Nguyen
(74) *Attorney, Agent, or Firm*—Keating & Bennett, LLP

(57) ABSTRACT

A method for manufacturing an electronic component includes the steps of forming an electrode layer including α-tungsten on a substrate at a substrate temperature of about 100° C. to about 300° C. by a sputtering process, processing the electrode layer so as to have a desired shape, and heat-treating the electrode layer. An electronic component includes a substrate and an electrode layer that is disposed on the substrate directly or indirectly, includes α-tungsten, and has a specific resistance of about 15 μΩ.cm or less and a warpage of about 120 μm or less. A surface acoustic wave filter includes a piezoelectric substrate and an electrode layer, disposed on the piezoelectric substrate, including α-tungsten.

11 Claims, 13 Drawing Sheets

METHOD FOR MANUFACTURING AN ELECTRONIC COMPONENT

BACKGROUND OF THE INVENTION

1. Field of the Invention

The present invention relates to a method for manufacturing an electronic component including an electrode layer including α-tungsten and also relates to such an electronic component and a surface acoustic wave filter.

2. Description of the Related Art

Conventionally, electrode layers for electronic components such as surface acoustic wave devices need to have low resistance. For example, electrode layers for interdigital transducers and reflectors used for surface acoustic wave devices need to have low resistance and also need to have high hardness. Furthermore, such electrode layers need to have low stress so as not to cause substrates to warp during layer formation.

Among metal films, a tungsten film has a bulk specific resistance of about 5 μΩ·cm, which is a small value, and has considerably high hardness. Thus, when the electrode layers for surface acoustic wave devices include tungsten, low insertion loss can be achieved. However, in the case of tungsten, it is known that layer stress, which causes substrate warping, and the change in specific resistance are large, depending on the pressure during layer formation.

In Japanese Unexamined Patent Application Publication No. 5-9721, hereinafter referred to as Related Document 1, the following technique is disclosed: a bias voltage is applied to a substrate and sputtering is performed to form an electrode layer including tungsten. In this technique, the layer stress can be controlled by applying the bias voltage while the specific resistance is prevented from increasing. Thus, a tungsten layer having a specific resistance of 11 μΩ·cm or less and a stress of 1 GPa or less, which are small values, can be formed by controlling the bias voltage V, the distance TS between a target and the substrate, and the pressure P during the layer formation.

On the other hand, in the Japanese Unexamined Patent Application Publication No. 5-263226, hereinafter referred to as Related Document 2, the following technique is disclosed: a tungsten layer is formed by a sputtering process using a mixed gas containing Ar and Xe. This technique uses the following phenomenon: the stress of a tungsten layer formed using Xe gas is different from that of another tungsten layer formed using an Ar gas. Thus, a tungsten layer having low specific resistance and low stress can be formed by controlling the mixing ratio of Xe and Ar gases within the following range:

$$0.1 \leqq Ar/(Ar+Xe) \leqq 0.4$$

In the bias sputtering process disclosed in Related Document 1, a bias voltage must be applied to the substrate. Thus, there is a problem in that the sputtering apparatus is complicated and the degree of design freedom is reduced. Furthermore, layers cannot be formed with an ordinary sputtering apparatus.

In the sputtering process, disclosed in Document 2, using the mixed gas, the cost of forming layers is high because the sputtering gas is expensive.

SUMMARY OF THE INVENTION

In order to solve the above-described problems of the conventional techniques, preferred embodiments of the present invention provide a method for manufacturing an electronic component including an electrode layer including α-tungsten, such an electronic component, and a surface acoustic wave filter, wherein the method does not require an expensive apparatus and sputtering gas, and the electrode layer is formed on a substrate.

According to a preferred embodiment of the present invention, a method for manufacturing an electronic component includes the steps of forming an electrode layer including α-tungsten on a substrate at a substrate temperature of about 100° C. to about 300° C. by a sputtering process, processing the electrode layer so as to have a desired shape, and heat-treating the electrode layer.

In the electrode layer-forming step of the above-described method, the α-tungsten electrode layer is formed at a degree of vacuum of less than about $2\times10^{-4}$ Pa, that is, at a pressure of less than about $2\times10^{-4}$ Pa. Thereby, the α-tungsten layer having low specific resistance can be obtained.

In the heat-treating step of the method, the α-tungsten electrode layer is preferably heat-treated at a temperature within the range of about 100° C. to about 400° C. Thereby, the α-tungsten layer having low specific resistance and stress can be obtained, and the substrate warpage can be securely prevented.

In the electrode layer-forming step of the method, the α-tungsten electrode layer is formed after at least one electrode layer including another metal material is formed on the substrate. Thus, the layered structure including the α-tungsten electrode layer and other metal electrode layer has high adhesive strength to the substrate when the other metal material has high adhesive strength to the substrate.

In the electrode layer-forming step of the method, after the α-tungsten electrode layer is formed, at least one electrode layer including another metal material is formed on the α-tungsten electrode layer. Thus, the layered structure including the α-tungsten electrode layer and the other metal electrode layer has superior electrical characteristics such as high conductivity when the other metal material has high conductivity.

In the method, the α-tungsten electrode layer is heat-treated before the α-tungsten electrode layer is processed so as to have a desired shape. Thus, the α-tungsten electrode layer can be formed and then readily processed in one sputtering apparatus.

In the method, the α-tungsten electrode layer is heat-treated after the α-tungsten electrode layer is processed so as to have a desired shape. Thus, stress caused by the shape processing can be relaxed in the heat-treating step. Thereby, the substrate warpage can be reliably prevented.

In the method of this preferred embodiment, the substrate includes a piezoelectric material and the electronic component is preferably a surface acoustic wave device. Thereby, such a surface acoustic wave device having low specific resistance and a low layer substrate can be obtained.

According to another preferred embodiment of the present invention, an electronic component includes a substrate and an electrode layer that is disposed on the substrate directly or indirectly, includes α-tungsten, and has a specific resistance of about 15 μΩ·cm or less and a warpage of about 120 μm or less.

The above-described electronic component further includes at least one electrode layer, disposed between the α-tungsten electrode layer and the substrate and/or disposed on the α-tungsten electrode layer, including another metal material other than α-tungsten. Thus, the layered structure including the α-tungsten electrode layer and the other metal electrode layer has high conductivity or high adhesive strength to the substrate when the other metal material has high conductivity or high adhesive strength to the substrate.

The electronic component further includes at least one interdigital electrode formed by processing the electrode layer, wherein the substrate includes a piezoelectric material and the electronic component is preferably a surface acoustic wave device. Thus, such a surface acoustic wave device having low specific resistance and stress can be obtained. In the device, the substrate warpage can be prevented.

According to another preferred embodiment of the present invention, a surface acoustic wave filter includes a piezoelectric substrate and an electrode layer, disposed on the piezoelectric substrate, including α-tungsten.

Other features, elements, characteristics, and advantages of the present invention will become more apparent from the following detailed description of preferred embodiments with reference to the attached drawings.

DESCRIPTION OF THE PREFERRED EMBODIMENTS

Preferred embodiments of the present invention will now be described with reference to the accompanying drawings.

Figure 1:
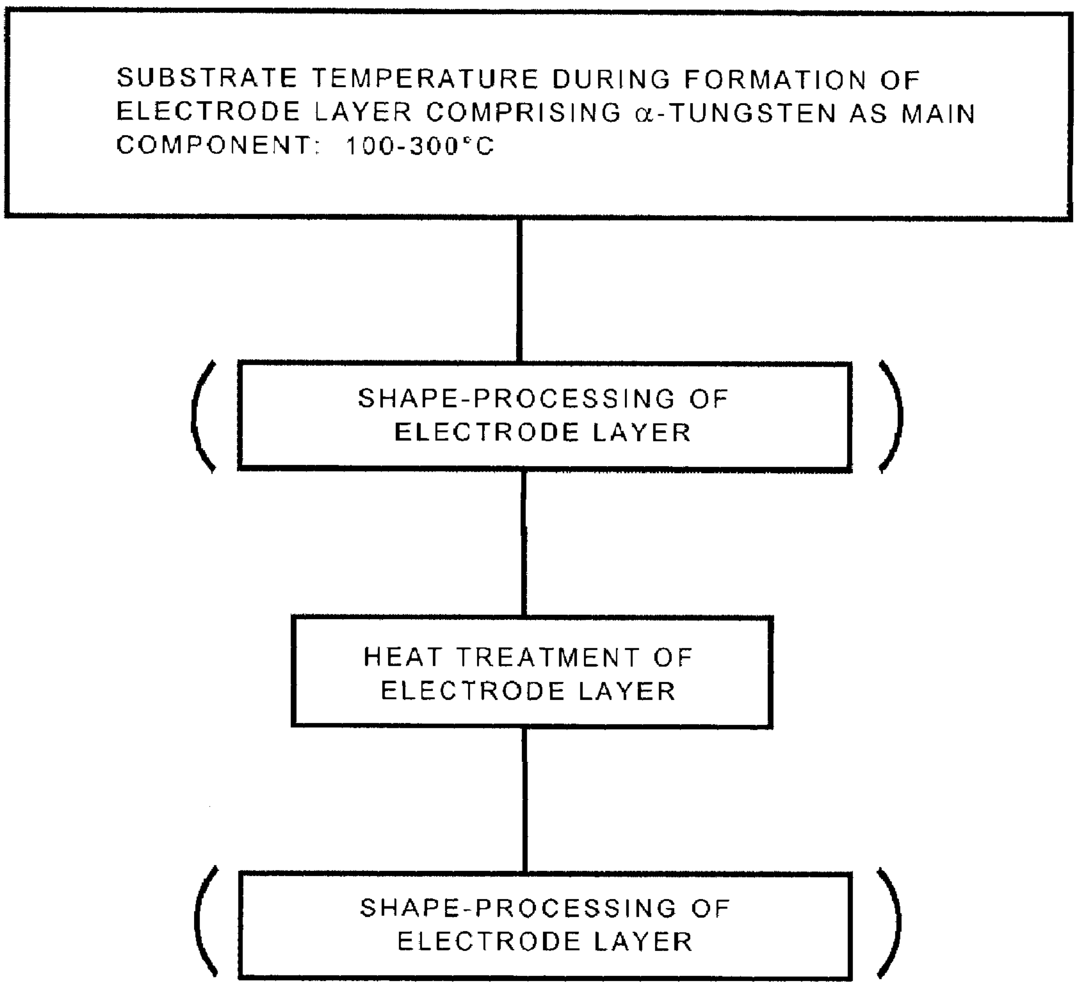
FIG. 1 is a schematic view showing steps of a method for manufacturing an electronic component according to a preferred embodiment of the present invention.

As shown in FIG. 1, in a method for manufacturing an electronic component according to preferred embodiments of the present invention, an electrode layer including α-tungsten is formed on a substrate directly or indirectly. In this case, the α-tungsten electrode layer is preferably formed at a substrate temperature of about 100° C. to about 300° C. by a sputtering process.

A sputtering apparatus used in this step is not limited to any particular type and a parallel plate-type or planetary-type sputtering apparatus may be used.

In the sputtering sub-step, the α-tungsten electrode layer is formed at a predetermined substrate temperature and a desired degree of vacuum. A target including tungsten is used. A sputtering gas containing only Ar can be used, or, alternatively, a Ne, Kr, or $N_2$ gas other than an Ar gas may be used. In either case, gas mixtures need not be prepared for the sputtering gas and thus an expensive gas need not be used. Therefore, the electrode layer can be formed at low cost.

The α-tungsten electrode layer is preferably formed at a substrate temperature of about 100° C. to about 300° C. This is because the α-tungsten electrode layer has low stress when it is formed within such a temperature range, as is clear from the examples described below.

The degree of vacuum is preferably less than about $2\times10^{-4}$ Pa (i.e. pressure is less than about $2\times10^{-4}$ Pa). When the degree of vacuum is about $2\times10^{-4}$ Pa or more, the α-tungsten electrode layer does not have sufficiently low specific resistance and stress in some cases.

The material for the substrate is not particularly limited and various materials can be used depending on the electronic component including the α-tungsten electrode layer. When, for example, a surface acoustic wave device is manufactured, the substrate preferably includes a piezoelectric single-crystalline material such as quartz crystal or a piezoelectric ceramic such as lead zirconate titanate. A piezoelectric substrate having a ZnO thin-film thereon may be used. Alternatively, an insulating substrate having a piezoelectric thin-film thereon may be used.

Figure 13:
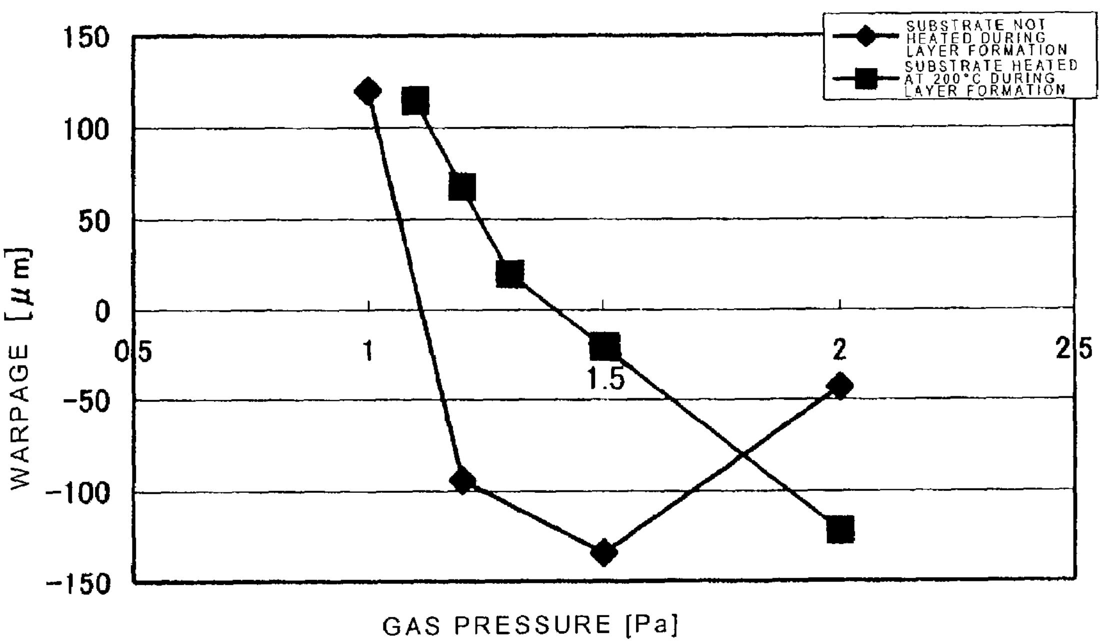
FIG. 13 is a graph showing the relationship between the Ar gas pressure and the warpage of substrates which are heated to about 200° C. or not heated.

When an Ar sputtering gas is used, the pressure thereof may be controlled within a range of about 1.0 Pa to about 2.0 Pa with a gas pressure control valve or a gas flow controller. As shown in FIG. 13, if the gas pressure is controlled within such a range, the substrate warpage can be controlled to be approximately 120 μm or less when the substrate temperature is about 200° C.

After the sputtering atmosphere and the substrate temperature are adjusted as described above, about 100 W to about 200 W of DC power is applied to a tungsten target to generate Ar ions, thereby sputtering the tungsten target. Tungsten particles generated from the target are deposited on the substrate, thereby forming the α-tungsten electrode layer.

The magnitude of the DC power may be varied depending on the size of the target. When a disk target having a diameter of about 10.16 cm is used, about 100 W to about 200 W of power may be applied thereto, as described above.

After the electrode layer is formed according to the above-described procedure, the electrode layer is processed so as to have a predetermined shape or it is heat-treated. This shape processing may be performed before or after the electrode layer is heat-treated.

When the heat treatment precedes the shape processing, there is a risk that the processed substrate is significantly warped and the layer stress is increased, thereby causing the electrode layer to peel from the substrate. In contrast, when the heat treatment follows the shape processing, the heat-treated substrate can be effectively prevented from warping and the layer stress can be reduced. Thus, the heat treatment is preferably performed after the shape processing.

After the electrode layer is formed, the substrate is preferably heat-treated in the sputtering apparatus without being exposed to the atmosphere. In this step, the substrate is heat-treated at a predetermined temperature for several hours. The predetermined temperature is preferably about 100° C. to about 400° C. As is clear from the examples described below, an α-tungsten electrode layer having low stress and low resistance can be obtained when the heat-treating temperature is within such a range.

After the substrate is withdrawn from the sputtering apparatus, the substrate including the electrode layer may be heat-treated in a heat-treating apparatus in which a large number of substrates can be treated in one batch. In this heat treatment, the atmosphere is not particularly limited and a vacuum or inert atmosphere may be used.

In the step of processing the electrode layer, an appropriate process such as a photolithographic etching process is used. In this step, the electrode layer is processed to have a desired shape. The resulting electrode layer can be used for, for example, interdigital transducers for surface acoustic wave devices.

In the step of forming the electrode layer, only the α-tungsten electrode layer may be formed on the substrate. Alternatively, at least one electrode layer including another metal material may be formed on the α-tungsten electrode layer, or the other metal material layer may be formed on the substrate to form the α-tungsten electrode layer thereon. When the other metal material has high conductivity and high adhesive strength to the substrate, the layered structure including the α-tungsten electrode layer and the other metal layer have low resistance and/or high adhesive strength to the substrate.

Examples of preferred embodiments of the present invention will now be described.

EXAMPLE 1

Figure 2:
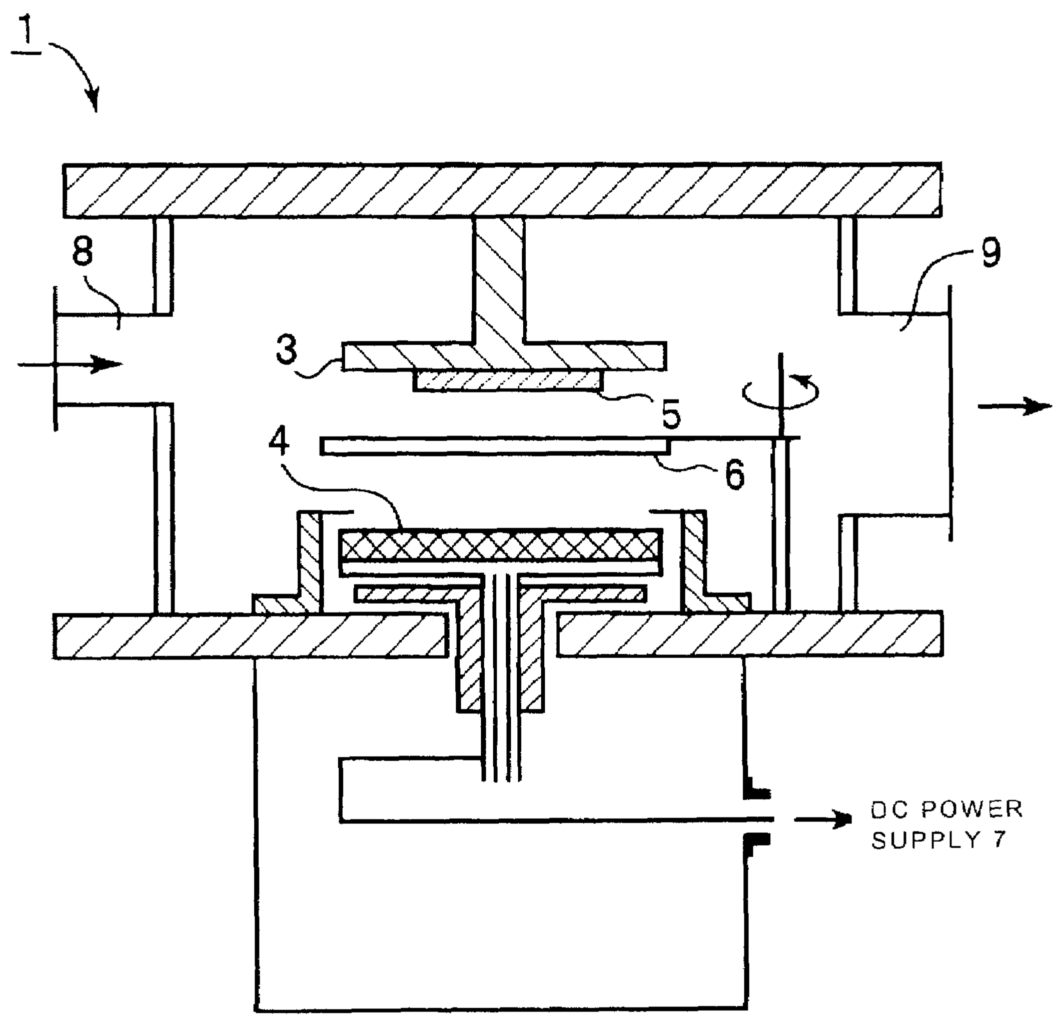
FIG. 2 is a schematic view showing an exemplary configuration of a sputtering apparatus used in a method of preferred embodiments of the present invention.

FIG. 2 is a sectional view showing a sputtering apparatus 1 used in this example. The sputtering apparatus 1 includes a sputtering chamber 2 and an anode 3. The sputtering chamber 2 is evacuated with an evacuator, which is not shown, to obtain a desired degree of vacuum. A target 4 is placed in the sputtering chamber 2 such that the target 4 faces the anode 3. A substrate 5 is placed on the surface of the anode 3 close to the target 4. The sputtering apparatus 1 is connected to a DC power supply 7. The sputtering apparatus 1 further includes a shutter 7, a gas inlet port 8, and a gas outlet port 9. A sputtering gas is introduced into the sputtering chamber 2 through the gas inlet port 8, and the resulting sputtering gas is then discharged through the gas outlet port 9.

An electrode layer including tungsten was formed on a first substrate including quartz crystal under the following conditions using the sputtering apparatus 1.

Figure 3:
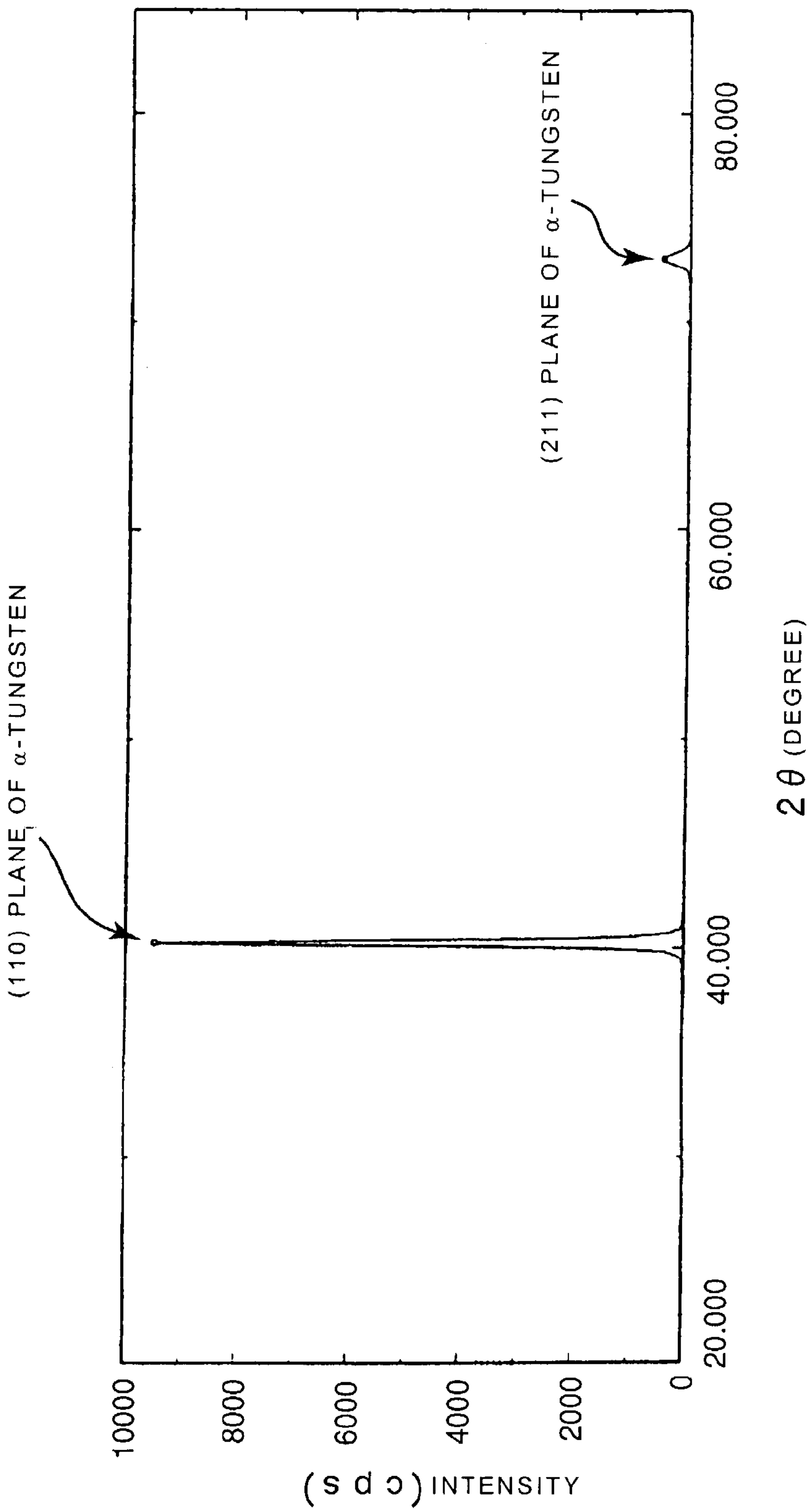
FIG. 3 is a graph showing an XRD spectrum of an α-tungsten layer formed in Example 1.

Target Material: Tungsten
Target Diameter: about 10.16 cm
Substrate Temperature: about 200° C.
Sputtering Gas: Ar
Sputtering Gas Pressure: about 1.1 Pa
Applied DC Power: about 100 W
Ultimate Degree of Vacuum: about $6.8\times10^{-5}$ Pa The crystallinity of the obtained tungsten layers was analyzed by an X-ray Diffraction (XRD) method. The XRD spectrum of the tungsten electrode layer on the first substrate of preferred embodiments of the present invention is shown in FIG. 3. For the sake of comparison, a comparative sample having another tungsten layer disposed on a second substrate was prepared under the same conditions as the above except that the second substrate was not heated. The XRD spectrum of the tungsten layer on the second substrate for comparative example is shown in FIG. 4.

As shown in FIG. 3, there is a sharp peak having strong intensity in the XRD spectrum. This peak is assigned to the (110) plane of α-tungsten. That is, α-tungsten is a major phase of the tungsten electrode layer on the first substrate. This tungsten electrode layer has a specific resistance of about 14.1 μΩ·cm, which is a small value, and it has no cracks therein.

Figure 4:
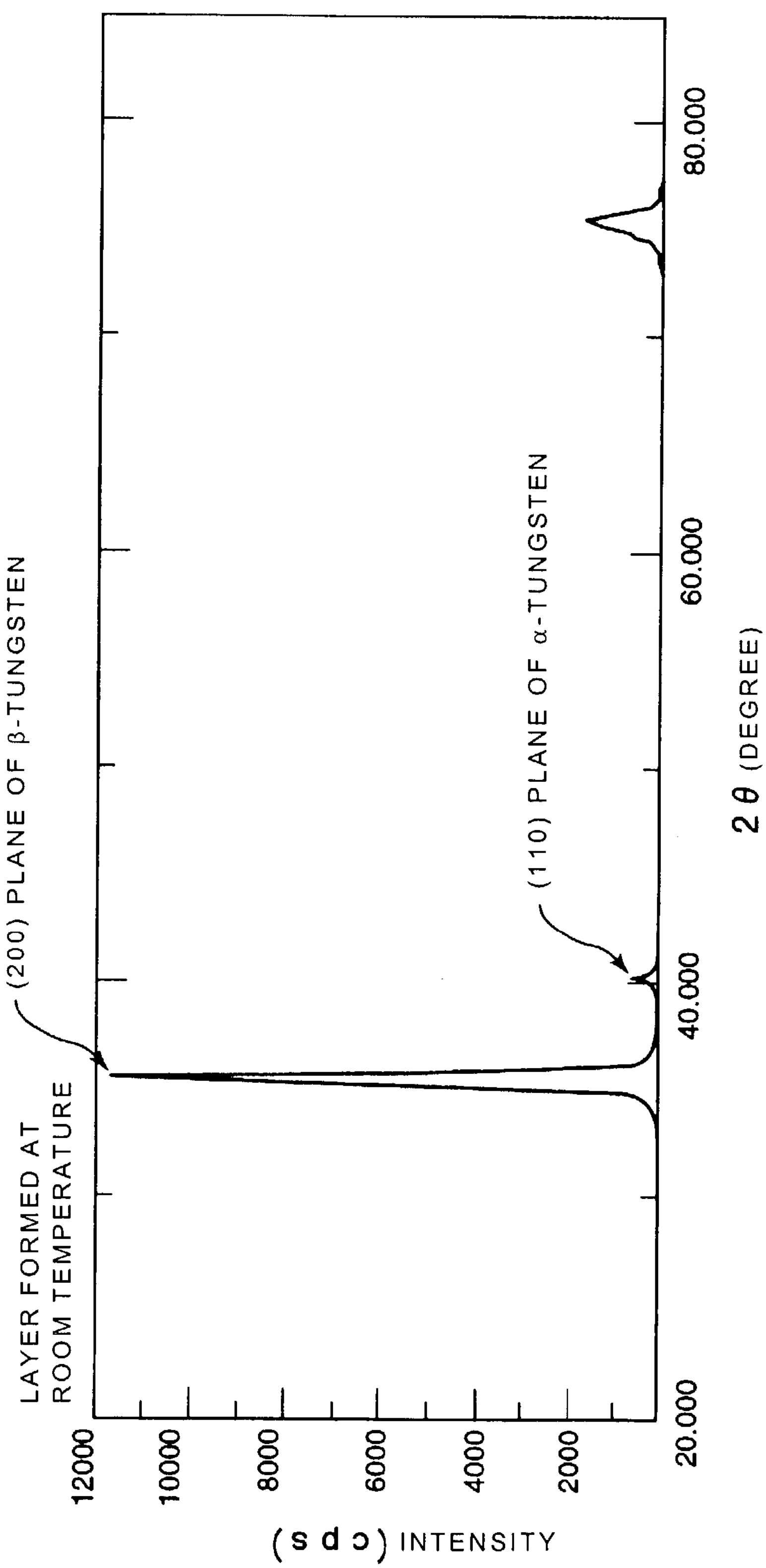
FIG. 4 is a graph showing an XRD spectrum of a tungsten layer of a comparative sample used for comparison in Example 1.

In contrast, as shown in FIG. 4, there is a sharp peak having strong intensity in the XRD spectrum. This peak is assigned to the (200) plane of β-tungsten. That is, β-tungsten is a major phase of the tungsten layer of the comparative sample. This tungsten layer has a specific resistance of about 1,570 μΩ·cm, which is an extremely large value, and it has many cracks therein.

Thus, it is clear that the tungsten electrode layer formed on the first substrate at a substrate temperature of about 200° C. has a smaller specific resistance and fewer cracks as compared with the tungsten layer formed on the second substrate without heating the second substrate.

EXAMPLE 2

Various samples were prepared in the same manner as that of Example 1 except that the substrate temperature during layer formation is different from that of Example 1 and the samples are heat-treated at about 300° C. for about three hours at a pressure of about $10^{-5}$ Pa in the sputtering apparatus 1 after the layer formation. Among the above samples, samples of a first group were prepared at an Ar gas pressure of about 1.1 Pa, which is the same value as that of Example 1, and samples of a second group were prepared at an Ar gas pressure of about 1.5 Pa.

Figure 5:
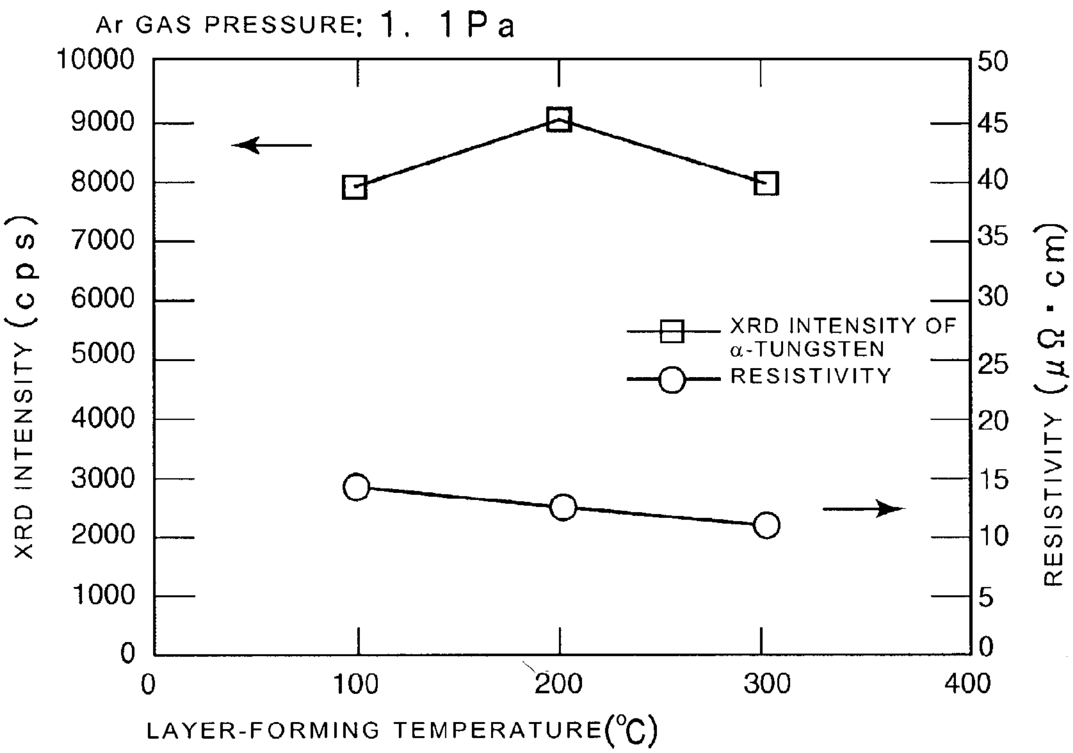
FIG. 5 is a graph showing the relationship between the layer-forming temperature and the intensity of a peak assigned to an α-tungsten layer and the relationship between the layer-forming temperature and the specific resistance in Example 2.
Figure 6:
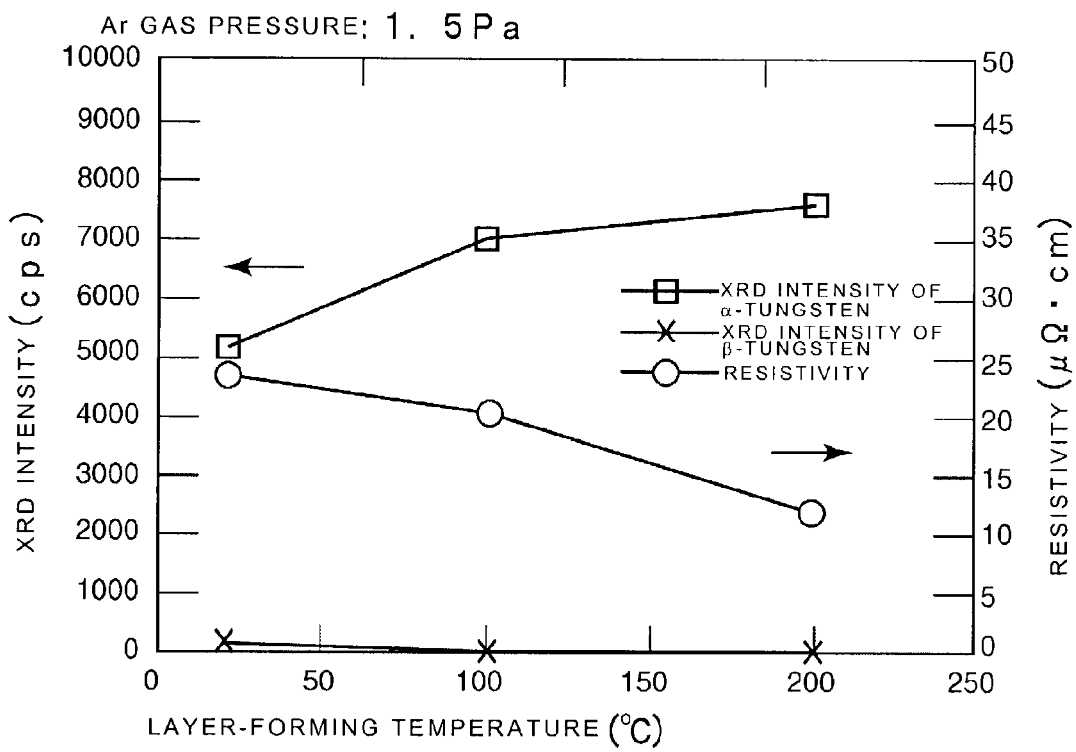
FIG. 6 is a graph showing the relationship between the layer-forming temperature and the intensity of a peak assigned to another α-tungsten layer and the relationship between the layer-forming temperature and the specific resistance in Example 2.

Tungsten layers of the obtained samples were analyzed by an XRD method to measure the intensity of a peak assigned to the (110) plane of α-tungsten. The specific resistance of the tungsten layers was also measured. Furthermore, the warpage of the substrates of the first group samples was measured. The XRD intensity and the specific resistance of the first group samples are shown in FIG. 5 and those of the second group samples are shown in FIG. 6. The warpage and the specific resistance of the first group samples are shown in FIG. 7.

In FIGS. 5 and 6, the symbol "□" represents the intensity of a peak assigned to the (110) plane of α-tungsten, the symbol "x" represents the intensity of a peak assigned to the (200) plane of β-tungsten, and the symbol "○" represents the specific resistance of the tungsten layers.

As shown in FIG. 6, in a tungsten layer formed at an Ar gas pressure of 1.5 Pa and a substrate temperature of about 23° C., which is substantially equal to room temperature, the specific resistance is about 24 μΩ·cm, which is a relatively large value, because there is a small portion of the β phase having high specific resistance, however the phase α occupies the major portion. In contrast, in other tungsten layers formed at an Ar gas pressure of about 1.1 Pa or about 1.5 Pa and a substrate temperature of about 100° C. or more, the specific resistance is smaller than that of the above tungsten layer, because there is the stable phase α alone. As shown in FIG. 5, in tungsten layers formed at an Ar gas pressure of about 1.1 Pa and a substrate temperature of about 100° C. or more, the specific resistance is about 15 μΩ·cm or less, which is an extremely small value.

Figure 7:
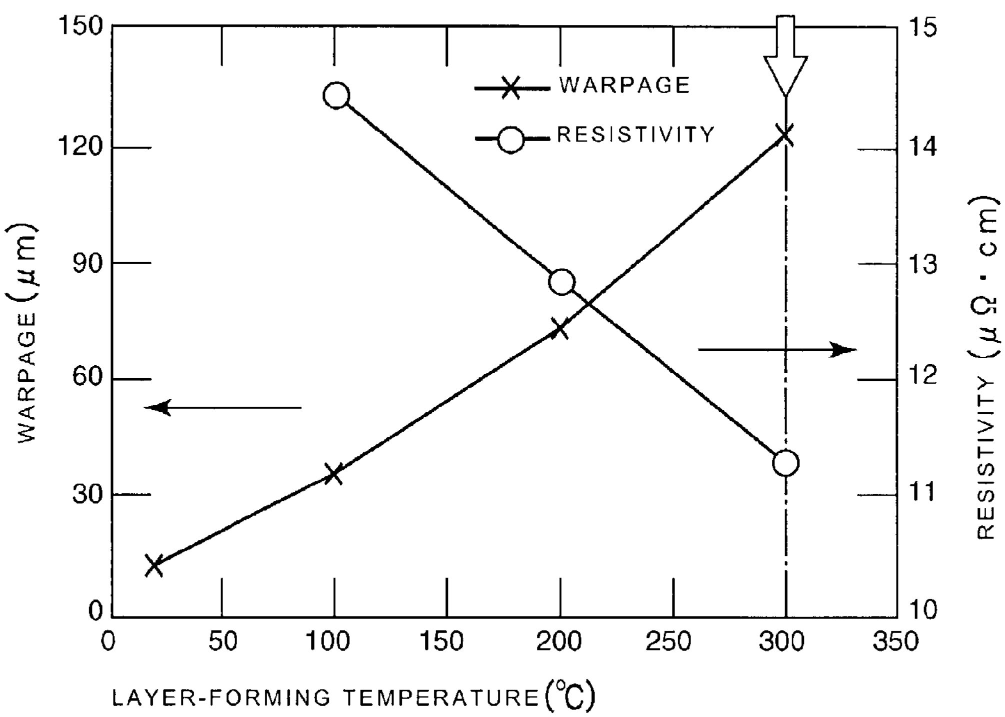
FIG. 7 is a graph showing the relationship between the warpage and the specific resistance of α-tungsten layers formed at different temperatures in Example 2.

FIG. 7 illustrates the relationship between the warpage and the layer-forming temperature, that is, the substrate temperature, and illustrates the relationship between the specific resistance and the layer-forming temperature. The scale of the specific resistance in FIG. 7 is larger than that in FIG. 5.

As shown in FIG. 7, the specific resistance decreases in inverse proportion to the layer-forming temperature and the warpage increases in proportion to the layer-forming temperature. For example, a sample including a tungsten layer formed at about 300° C. has a warpage of approximately 124 μm. When the warpage exceeds this value, the adhesiveness of the tungsten layer to the substrate is deteriorated and desired electrical characteristics cannot be obtained in some cases. Thus, in consideration of the increase in warpage, the substrate temperature must be about 300° C. or less in order to form a tungsten electrode layer having low specific resistance and stress.

According to Examples 1 and 2, when the substrate temperature is controlled within the range of about 100° C. to about 300° C., an α-tungsten electrode layer having a small specific resistance and a small warpage due low stress can be obtained.

EXAMPLE 3

Various samples each including a tungsten layer were prepared. Each tungsten layer was formed in the same manner as that of Example 1 except that the ultimate degree of vacuum was varied. The specific resistance of the tungsten layers was measured. The relationship between the ultimate degree of vacuum and the specific resistance is shown in FIG. 8 using the symbol "○".

Figure 8:
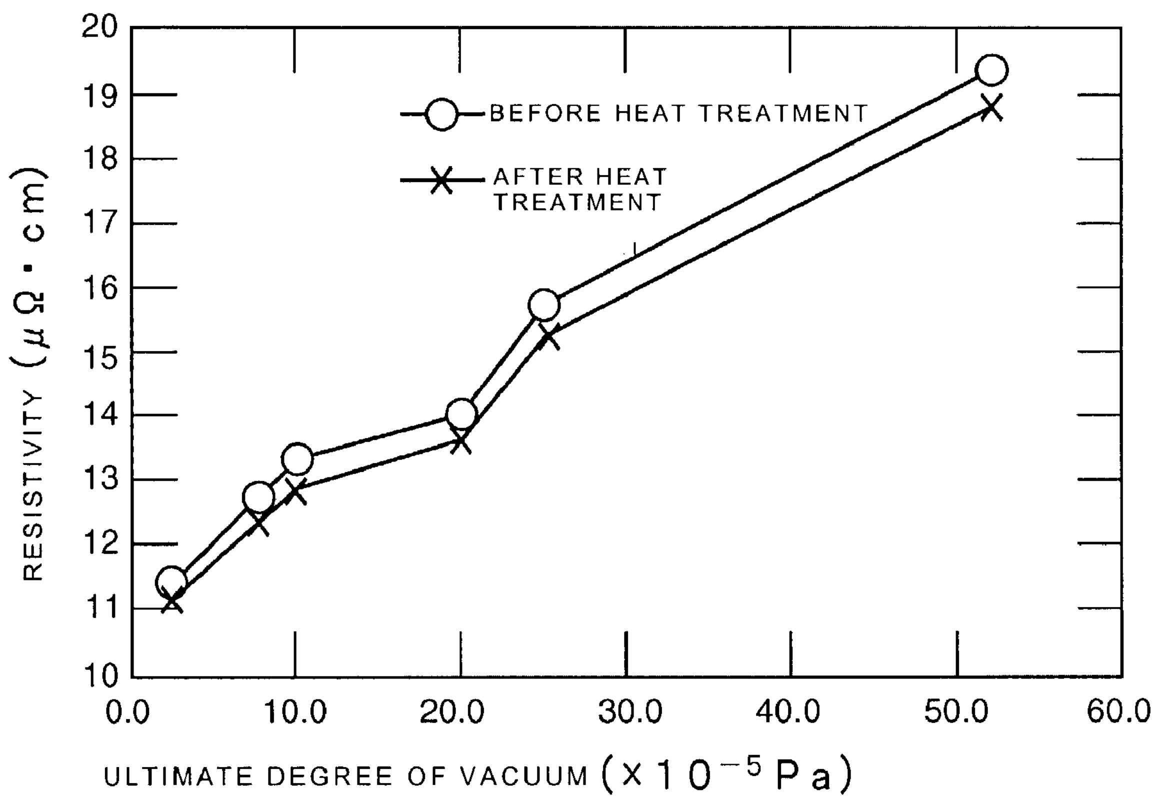
FIG. 8 is a graph showing the relationship between the ultimate degree of vacuum during layer formation and the specific resistance of tungsten layers formed in Examples 3 and 4.

As shown in FIG. 8, the specific resistance decreases in proportion to the ultimate degree of vacuum. When the ultimate degree of vacuum is about $2.5\times10^{-4}$ Pa or more, the specific resistance exceeds approximately 15 μΩ·cm. Thus, in order to form a tungsten layer having a specific resistance of about 15 μΩ·cm or less, the ultimate degree of vacuum must not exceed about $2.0\times10^{-4}$ Pa. When the ultimate degree of vacuum is about $2.0\times10^{-5}$ Pa, the specific resistance is about 11 μΩ·cm. That is, a tungsten layer having a small specific resistance close to about 10 μΩ·cm can be obtained.

EXAMPLE 4

Various samples each including a tungsten layer were prepared in the same manner as that of Example 3 except that the samples were heat-treated at about 350° C. for three hours under a reduced pressure without being exposed to the atmosphere. The specific resistance of each tungsten layer was measured in the same manner as that of Example 3. The relationship between the ultimate degree of vacuum and the specific resistance is shown in FIG. 8. In FIG. 8, the symbol "○" represents the specific resistance of the non-heat-treated samples, and the symbol "x" represents the specific resistance of the heat-treated samples.

As shown in FIG. 8, in the heat-treated samples, the specific resistance decreases in proportion to the ultimate degree of vacuum. The heat-treated samples have a smaller specific resistance as compared with the non-heat-treated samples prepared in Example 3 over the range of the ultimate degree of vacuum.

EXAMPLE 5

Figure 9:
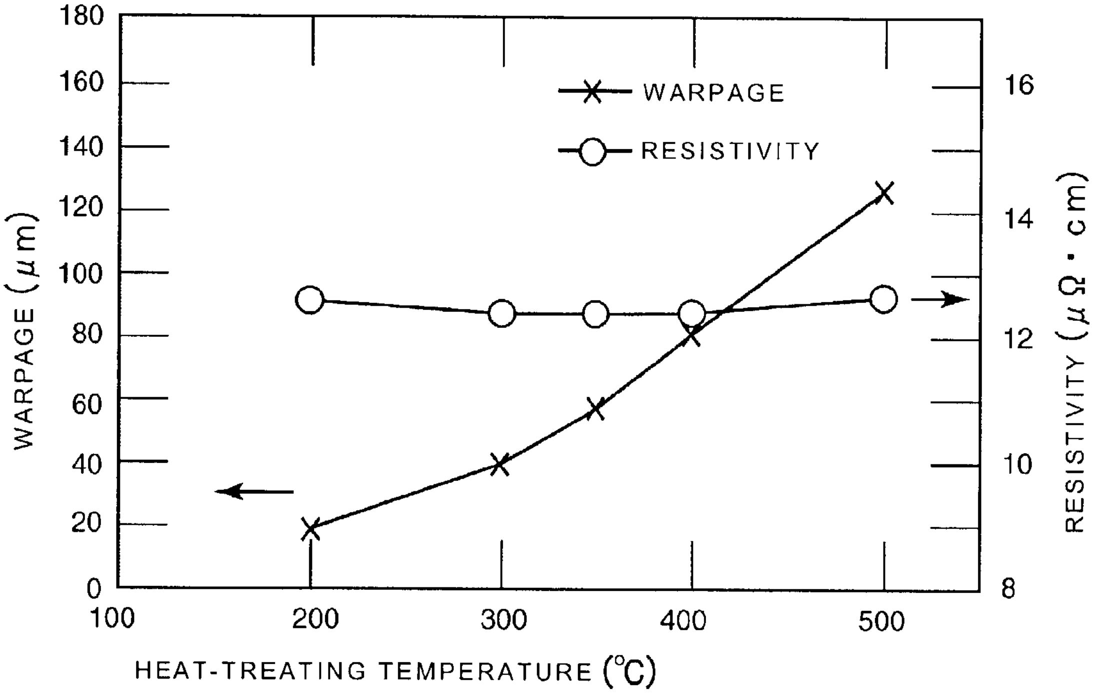
FIG. 9 is a graph showing the relationship between the warpage and the specific resistance of α-tungsten layers formed at different temperatures in Example 4.

Various samples each including a tungsten layer were prepared. Each tungsten layer was formed on a substrate in the same manner as that of Example 4 except that the layer-forming temperature is about 200° C. and the heat-treating temperature is varied. The relationship between the heat-treating temperature and the warpage and the relationship between the heat-treating temperature and the specific resistance of the tungsten layer are shown in FIG. 9. In FIG. 9, the symbol "x" represents the warpage and the symbol "○" represents the specific resistance.

As shown in FIG. 9, the specific resistance slightly decreases in inverse proportion to the heat-treating temperature up to about 400° C., and the warpage increases in proportion to the heat-treating temperature. When the heat-treating temperature is about 400° C., the warpage is about 100 μm or less, which is a small value. On the other hand, when the heat-treating temperature exceeds about 400° C., the specific resistance increases in proportion to the heat-treating temperature. When the heat-treating temperature is about 500° C., the warpage is approximately 100 μm or more.

As shown in FIG. 9, it is clear that a tungsten layer having low stress and specific resistance can be formed when the heat-treating temperature is controlled within the range of about 200° C. to about 400° C. The heat-treating temperature is preferably about 300° C. to about 400° C. When the heat-treating temperature is controlled within such a range, the warpage and the specific resistance can be controlled to be about 100 μm or less and about 13 μΩ·cm, respectively, which are extremely small values.

Data of the samples each including a tungsten layer formed at about 200° C. is shown in FIG. 9. When the layer-forming temperature is about 100° C., the heat-treating temperature may be about 100° C. Thus, the heat-treating temperature is within the range of about 100° C. to about 400° C. Thereby, sufficiently low specific resistance and warpage can be achieved in the same manner as that in this example.

Figure 10:
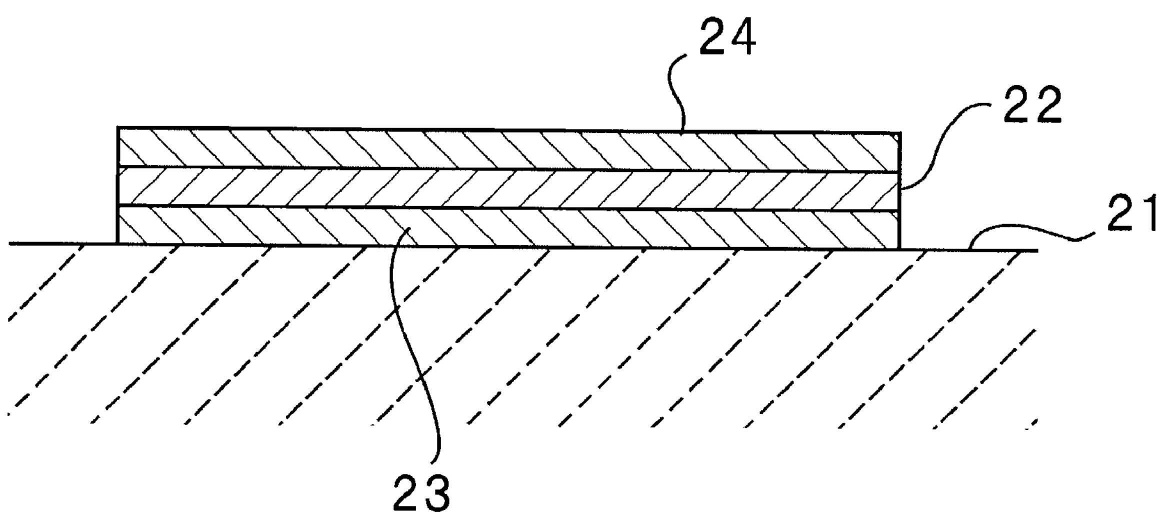
FIG. 10 is a fragmentary sectional view illustrating a variation of an electronic component according to preferred embodiments of the present invention, wherein the electronic component has a configuration in which an electrode layer including α-tungsten is disposed between other electrode layers including another metal material.

In the above examples, an α-tungsten electrode layer is directly disposed on a substrate. In the present invention, at least one electrode layer including another metal material may be disposed on and/or under the α-tungsten electrode layer. FIG. 10 is a fragmentary sectional view showing a configuration of such a variation.

A manufacturing method according to the variation will now be described.

A first electrode layer 23 is formed on a substrate 21, and a second electrode layer 22 including α-tungsten is then formed thereon in one sputtering apparatus. The first electrode layer 23 may include Cr—Ni alloy, Ti, or Al. Thereby, the first electrode layer 23 has high adhesive strength to the substrate 21.

A third electrode layer 24 is then formed on the second electrode layer 22 in the sputtering apparatus. The third electrode layer 24 may include a high conductive material such as Au or Al.

In the configuration of the variation shown in FIG. 10, the first electrode layer 23 disposed under the second electrode layer 22 preferably includes Cr—Ni alloy, Ti, or Al. Thus, the layered structure including the first, second, and third electrode layers 22, 23 and 24 has high adhesive strength to the substrate 21 and high conductivity.

As described above, an electronic component according to preferred embodiments of the present invention has a configuration in which an electrode layer including a metal material other than tungsten is disposed on and/or under an α-tungsten electrode layer. Thus, the layered structure including the different electrode layers has high adhesive strength to substrates and high conductivity.

In FIG. 10, the first electrode layer 23 is disposed under the second electrode layer 22, and the third electrode layer 24 is disposed on the second electrode layer 22, wherein the first and second electrode layers 23 and 24 have a single layer structure. However, the first and second electrode layers 23 and 24 including a metal material other than tungsten may have a multilayer structure. Alternatively, an electrode layer including a metal material other than tungsten may be disposed either on or under the second electrode layer 22.

In the configuration of the variation shown in FIG. 10, the first electrode layer 23 includes Cr—Ni alloy, Ti, or Al. However, the first electrode layer 23 may include another metal material. Furthermore, other than Au and Al, the third electrode layer 24 may include an alloy or metal, such as Ag, having a specific resistance smaller than that of α-tungsten.

The second electrode layer 22 including α-tungsten does not have a sufficiently large adhesive strength to the substrate 21. Thus, there is a risk that the second electrode layer 22 is peeled off from the substrate 21 when the warpage is large. However, in this variation, the peeling-off can be reliably prevented because the first electrode layer 23 includes such a material having higher adhesive strength to the substrate 21 as compared with that of α-tungsten.

Figure 11:
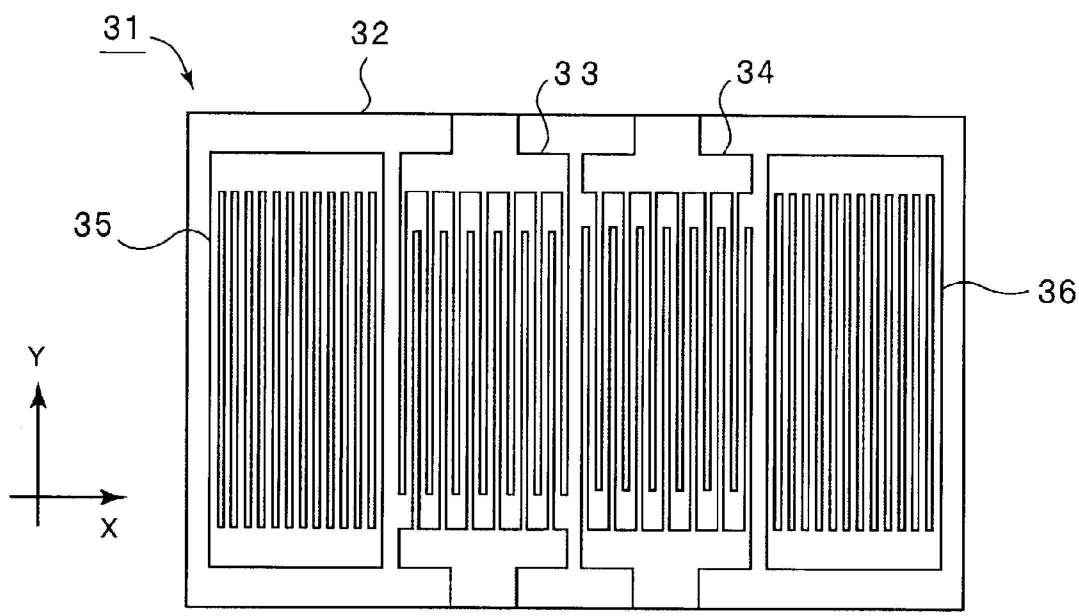
FIG. 11 is a schematic plan view showing an surface acoustic wave device, which is an example of an electronic component according to preferred embodiments of the present invention.

FIG. 11 is a schematic plan view showing an exemplary electronic component manufactured by a method according to a preferred embodiment of the present invention. The electronic component shown in FIG. 11 is a surface acoustic wave filter 31. The surface acoustic wave filter 31 includes a piezoelectric substrate 32 including quartz crystal, first and second IDT electrodes 33 and 34, and first and second reflective electrodes 35 and 36, wherein the electrodes are disposed on the piezoelectric substrate 32. The surface acoustic wave filter 31 is manufactured according to the following procedure: an electrode layer including α-tungsten is formed on the piezoelectric substrate 32 by a sputtering process; the formed electrode layer is processed into the first and second IDT electrodes 33 and 34 and the first and second reflective electrodes 35 and 36, as shown in FIG. 11, by a reactive ion etching process; the formed electrodes are then heat-treated under conditions according to any one of the above examples of preferred embodiments of the present invention. Thus, according to preferred embodiments of the present invention, these electrodes including α-tungsten can be formed without using expensive sputtering gas and an intricate apparatus. Furthermore, the surface acoustic wave filter 31 including the electrodes having low specific resistance and high hardness can be obtained.

The piezoelectric substrate 32 may include a piezoelectric material, such as $LiTaO_3$ or $LiNbO_3$, other than quartz crystal. When the piezoelectric substrate 32 includes such a material, the above-described characteristics can be also obtained.

Figure 12:
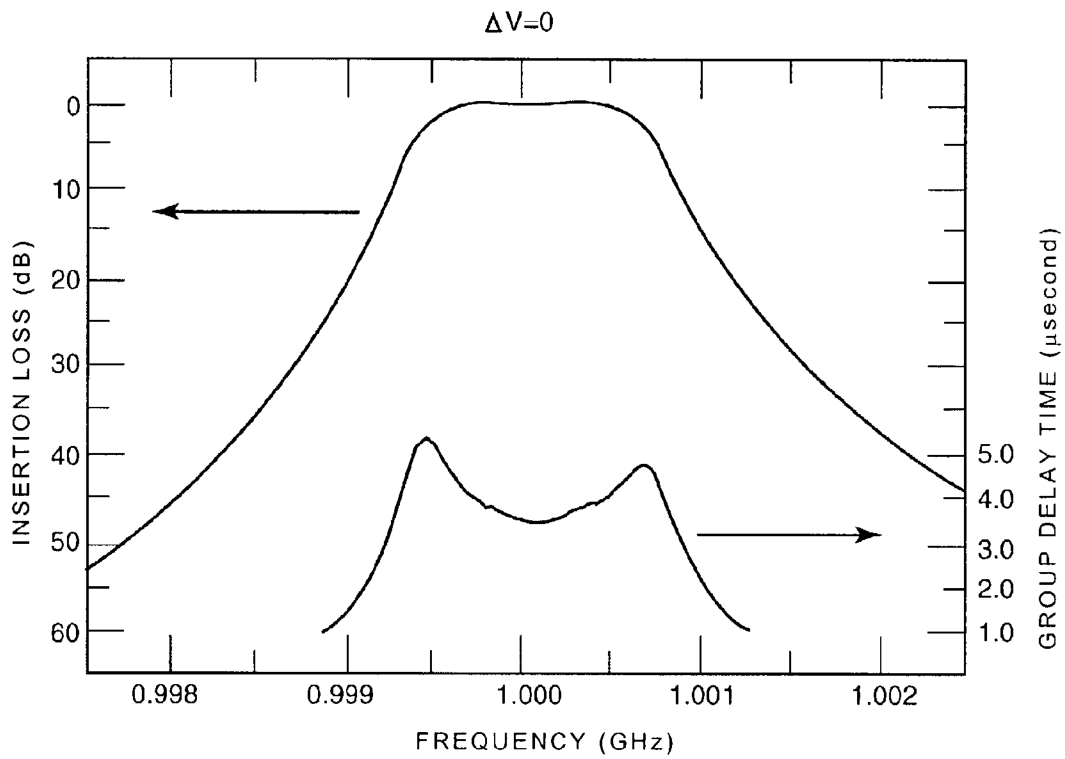
FIG. 12 is a graph showing the relationship between the frequency and the insertion loss of the surface acoustic wave device shown in FIG. 11 and the relationship between the frequency and the group delay time of the same.

FIG. 12 is a graph showing the relationship between the frequency and the insertion loss of a surface acoustic wave device manufactured according to the above-described procedure and the relationship between the frequency and the group delay time of the same.

A method according to the present invention is not limited to methods for manufacturing surface acoustic wave devices and can be generally used for manufacturing electronic components including α-tungsten electrode layers. An electronic component according to the present invention is not limited to such surface acoustic wave devices.

In preferred embodiments of the present invention, a method for manufacturing an electronic component preferably includes the steps of forming an electrode layer including α-tungsten on a substrate at a substrate temperature of about 100° C. to 300° C. by a sputtering process, processing the electrode layer so as to have a desired shape, and heat-treating the electrode layer. Since it is not necessary to use an intricate apparatus and expensive gas in the sputtering process, the α-tungsten electrode layer having low specific resistance, high hardness, and low warpage can be formed at low cost by controlling the substrate temperature within a predetermined range. Thus, such an electronic component including the α-tungsten electrode layer can be manufactured at low cost.

An electronic component of preferred embodiments of the present invention includes a substrate and an electrode layer that is disposed on the substrate directly or indirectly, includes α-tungsten, and has a specific resistance of about 15 μΩ·cm or less and a warpage of about 120 μm or less. Therefore, the electrode layer is prevented from peeling off of the substrate because the electrode layer has a small warpage even though it includes α-tungsten, which is a material having high hardness. Thus, such an electronic component including the electrode layer having low specific resistance, low warpage, and high hardness can be obtained.

A surface acoustic wave filter of preferred embodiments of the present invention includes a piezoelectric substrate and an electrode layer, disposed on the piezoelectric substrate, including α-tungsten. The electrode layer may be formed by a method of other preferred embodiments of the present invention. Thus, it is possible to manufacture such a surface acoustic wave filter including the α-tungsten electrode layer having low specific resistance, high hardness, and low warpage at low cost.

While preferred embodiments of the invention have been described above, it is to be understood that variations and modifications will be apparent to those skilled in the art without departing the scope and spirit of the invention. The scope of the invention, therefore, is to be determined solely by the following claims.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A method for manufacturing an electronic component, comprising the steps of: forming an electrode layer including α-tungsten on a substrate at a substrate temperature of about 100° C. to about 300° C. by a sputtering process, processing the electrode layer so as to have a desired shape;

and heat-treating the electrode layer; wherein the substrate includes a piezoelectric material.

2. The method for manufacturing an electronic component according to claim 1, wherein the α-tungsten electrode layer is formed at a pressure of less than about $2\times10^{-4}$ Pa in the electrode layer forming step.

3. The method for manufacturing an electronic component according to claim 1, wherein the α-tungsten electrode layer is heat-treated at a temperature within the range of about 100° C. to about 400° C. in the heat-treating step.

4. The method for manufacturing an electronic component according to claim 1, wherein the α-tungsten electrode layer is formed after at least one electrode layer including another metal material is formed on the substrate in the electrode layer forming step.

5. The method for manufacturing an electronic component according to claim 1, wherein, after the α-tungsten electrode layer is formed, at least one electrode layer including another metal material is formed on the α-tungsten electrode layer in the electrode layer-forming step.

6. The method for manufacturing an electronic component according to claim 1, wherein the α-tungsten electrode layer is heat-treated before the α-tungsten electrode layer is processed so as to have a desired shape.

7. The method for manufacturing an electronic component according to claim 1, wherein the α-tungsten electrode layer is heat-treated after the α-tungsten electrode layer is processed so as to have a desired shape.

8. The method for manufacturing an electronic component according to claim 1, wherein the electronic component is a surface acoustic wave device.

9. The method for manufacturing an electronic component according to claim 1, wherein the α-tungsten electrode layer is a second electrode layer and is formed after at least one first electrode layer including another metal material is formed on the substrate, and a third electrode layer including another metal material is formed on the α-tungsten electrode layer after the α-tungsten electrode layer is formed on the first electrode layer formed on the substrate.

10. The method for manufacturing an electronic component according to claim 9, wherein the first electrode layer includes at least one of Cr—Ni alloy, Ti, and Al.

11. The method for manufacturing an electronic component according to claim 9, wherein the third electrode layer includes at least one of Au and Al.

* * * * *